(12) United States Patent
Chen et al.

(10) Patent No.: US 11,024,551 B1
(45) Date of Patent: Jun. 1, 2021

(54) METAL REPLACEMENT VERTICAL INTERCONNECTIONS FOR BURIED CAPACITANCE

(71) Applicant: INTERNATIONAL BUSINESS MACHINES CORPORATION, Armonk, NY (US)

(72) Inventors: Hsueh-Chung Chen, Cohoes, NY (US); Lawrence A. Clevenger, Saratoga Springs, NY (US); Daniel James Dechene, Watervliet, NY (US); Somnath Ghosh, Clifton Park, NY (US); Carl Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/735,857

(22) Filed: Jan. 7, 2020

(51) Int. Cl.
| | |
|---|---|
| *H01L 21/768* | (2006.01) |
| *H01L 21/8238* | (2006.01) |
| *H01L 21/02* | (2006.01) |
| *H01L 21/306* | (2006.01) |
| *H01L 23/528* | (2006.01) |
| *H01L 23/522* | (2006.01) |
| *H01L 23/532* | (2006.01) |

(52) U.S. Cl.
CPC ........... *H01L 21/823871* (2013.01); *H01L 21/02532* (2013.01); *H01L 21/30604* (2013.01); *H01L 21/76877* (2013.01); *H01L 23/528* (2013.01); *H01L 23/5223* (2013.01); *H01L 23/5228* (2013.01); *H01L 23/53228* (2013.01)

(58) Field of Classification Search
CPC ....... H01L 21/76877; H01L 21/823871; H01L 23/5223
See application file for complete search history.

(56) References Cited

U.S. PATENT DOCUMENTS

| | | |
|---|---|---|
| 5,714,394 A | 2/1998 | Kadosh et al. |
| 6,532,143 B2 | 3/2003 | Figueroa et al. |
| 7,211,885 B2 | 5/2007 | Nordal et al. |
| 7,692,284 B2 | 4/2010 | Eilert et al. |
| 7,859,820 B2 | 12/2010 | Togashi |
| 8,437,192 B2 | 5/2013 | Lung et al. |
| 9,524,964 B2 | 12/2016 | Jing et al. |
| 2002/0117753 A1 | 8/2002 | Lee et al. |
| 2008/0186650 A1 | 8/2008 | Beker et al. |

(Continued)

*Primary Examiner* — Errol V Vernandes
(74) *Attorney, Agent, or Firm* — Tutunjian & Bitetto, P.C.; Randall Bluestone (57) ABSTRACT

A method is presented for forming a multi-level of interconnects underneath a complementary metal oxide semiconductor (CMOS) device. The method includes forming a stack including alternating layers of a semiconductor material and a first conductive material, patterning vias in the stack to define multiple stacks, depositing a first block material within each of the vias, forming a series of first block materials within a first via, forming a series of second block materials within a second via, the first and second vias being on opposed ends of a stack of the multiple stacks, and performing vertical metallization between the first block material and the series of first block materials in the first via, and between the first block material and the series of second block materials in the second via.

20 Claims, 5 Drawing Sheets

(56) References Cited

U.S. PATENT DOCUMENTS

2010/0237402 A1\* 9/2010 Sekine .................. H01L 29/792
                                                    257/324
2014/0133065 A1   5/2014 Armstrong et al.
2017/0236779 A1\* 8/2017 Komori ............. H01L 23/53266
                                                    257/326

\* cited by examiner

METAL REPLACEMENT VERTICAL INTERCONNECTIONS FOR BURIED CAPACITANCE

BACKGROUND

The present invention relates generally to semiconductor devices, and more specifically, to metal replacement vertical interconnections for high-density buried capacitance.

Complementary metal-oxide-semiconductor (CMOS) technology is commonly used for fabricating field effect transistors (FETs) as part of advanced integrated circuits (IC), such as CPUs, memory, storage devices, and the like. At the core of FETs, a channel region is formed in an n-doped or p-doped semiconductor substrate on which a gate structure is formed. Depending whether the on-state current is carried by electrons or holes, the FET comes as an n-FET device or a p-FET device. The overall fabrication process can include forming a gate structure over a channel region connecting source-drain regions within the substrate on opposite sides of the gate, usually with some vertical overlap between the gate and the source-drain region. The dimensions of semiconductor FETs have been steadily shrinking, as scaling to smaller dimensions leads to continuing device performance improvements. An on-chip decoupling capacitor (DECAP) is desired in some applications. However, on-chip capacitors consume a significant chip area. Thus, with increased device scaling, new capacitor arrangements are being examined.

SUMMARY

In accordance with an embodiment, a method is provided for forming a multi-level of interconnects underneath a complementary metal oxide semiconductor (CMOS) device. The method includes forming a stack including alternating layers of first and second semiconductor materials, patterning a via in the stack to define a first stack portion and a second stack portion, depositing a first block material within one side of the via such that the first block material directly contacts all of the alternating layers of the first and second semiconductor materials of the first stack portion, depositing a second block material within another side of the via such that the second block material directly contacts one layer of the second semiconductor material of the second stack portion, removing exposed second semiconductor material layers from the second stack portion to form openings, filling the openings with a first conductive material, and performing vertical metallization between the first and second block materials.

In accordance with another embodiment, a method is provided for forming a multi-level of interconnects underneath a complementary metal oxide semiconductor (CMOS) device. The method includes forming a stack including alternating layers of a semiconductor material and a conductive material, patterning a via in the stack to define a first stack portion and a second stack portion, depositing a first block material within one side of the via such that the first block material directly contacts all of the alternating layers of the semiconductor material and the conductive material of the first stack portion, depositing a second block material within another side of the via such that the second block material directly contacts one layer of the conductive material of the second stack portion, and performing vertical metallization between the first and second block materials.

In accordance with yet another embodiment, a method is provided for forming a multi-level of interconnects underneath a complementary metal oxide semiconductor (CMOS) device. The method includes forming a stack including alternating layers of a semiconductor material and a first conductive material, patterning vias in the stack to define multiple stacks, depositing a first block material within each of the vias, forming a series of first block materials within a first via, forming a series of second block materials within a second via, the first and second vias being on opposed ends of a stack of the multiple stacks, and performing vertical metallization between the first block material and the series of first block materials in the first via, and between the first block material and the series of second block materials in the second via.

In accordance with an embodiment, a semiconductor device for forming a multi-level of interconnects underneath a complementary metal oxide semiconductor (CMOS) device is provided. The semiconductor device includes a first stack portion including alternating layers of first and second semiconductor materials, a second stack portion including a SiGe layer disposed between two conductive layers, the first and second stack portions disposed on a substrate, a first block material directly contacting a sidewall of the first stack portion, a second block material directly contacting the SiGe layer of the second stack portion, the second block being smaller than the first block, and a conductive material disposed between the first and second stack portions to define a single capacitor in the second stack portion.

In accordance with another embodiment, a semiconductor device for forming a multi-level of interconnects underneath a complementary metal oxide semiconductor (CMOS) device is provided. The semiconductor device includes a first stack portion including alternating layers of a semiconductor material and a first conductive material, a second stack portion including alternating layers of the semiconductor material and the first conductive material, the first and second stack portions disposed on a substrate, a first block material directly contacting a sidewall of the first stack portion, a second block material directly contacting a middle or central conductive layer of the second stack portion, the second block being smaller than the first block, and a second conductive material disposed between the first and second stack portions to define a dual capacitor in the second stack portion.

In accordance with yet another embodiment, a semiconductor device for forming a multi-level of interconnects underneath a complementary metal oxide semiconductor (CMOS) device is provided. The semiconductor device includes a stack including alternating layers of a semiconductor material and a first conductive material, a first block material formed on opposed ends of the stack, the first block material extending an entire length of the stack, a series of first block materials disposed adjacent the first block material on one side of the stack, a series of second block materials disposed adjacent the second block material on the other side of the stack, and a second conductive material disposed between the first block material and the series of first block materials on one side of the stack, and between the first block material and the series of second block materials on the other side of the stack.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for a buried multi-level capacitor under the device level with vertical interconnections to different levels of the capacitor. Decoupling capacitors are necessary for noise reduction on supply voltages in high speed circuits, yet consume chip area. Existing capacitor structures fall into two main categories, that is, front end-of-the-line (FEOL) caps and back end-of-the-line (BEOL) caps. FEOL caps are limited by fin and gate patterning, as well as ground rules to achieve certain capacitance per unit area (density). FEOL caps further tend to utilize significant chip area. BEOL caps are limited in that BEOL stacks waste far BEOL routing resources (possible area penalty) and are naturally large in size due to placement in the stack, thus causing risk of breakdown in the field, as well as chip failure.

Embodiments in accordance with the present invention alleviate such complications in existing decoupling capacitors by providing methods and devices that do not waste any FEOL device area or routing resources by employing self-contained devices with connections through existing bottom contact rails. The pre-patterning of capacitor devices allows for a controllable plate area to limit risk of breakdown in the field. Further, connecting locally to devices allows for better proximity to switching field effect transistors (FETs) due to a potential reduction in series resistance. Moreover, a selectable number of plates (layers) enables scalable performance benefit versus conventional devices.

Examples of semiconductor materials that can be used in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
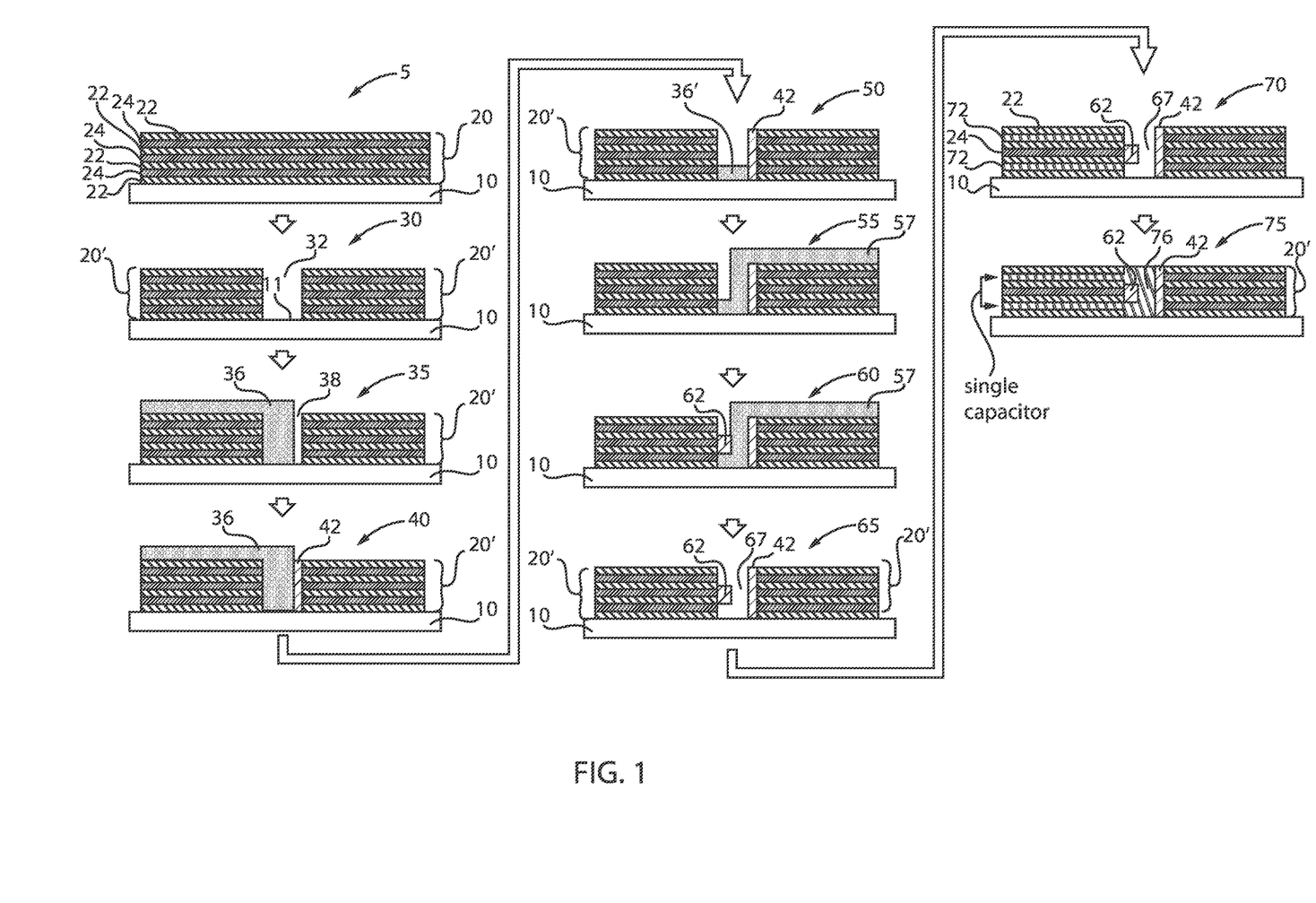
FIG. 1 is a replacement metal plate process flow for forming a vertical interconnect to a buried capacitor (referred to as a 2-electrode decoupling capacitor), in accordance with an embodiment of the present invention.

FIG. 1 is a replacement metal plate process flow for forming a vertical interconnect to a buried capacitor (referred to as a 2-electrode decoupling capacitor), in accordance with an embodiment of the present invention.

Structure 5 includes a semiconductor substrate 10. A nanosheet stack 20 can be formed over the substrate 10. The nanosheet stack 20 can include, e.g., alternating layers of a first semiconductor material 22 and a second semiconductor material 24. The first semiconductor material 22 can be, e.g., silicon (Si) and the second semiconductor material 24 can be, e.g., silicon germanium (SiGe).

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include an organic semiconductor or a layered semiconductor such as, for example, Si/SiGe, a silicon-on-insulator or a SiGe-on-insulator. A portion or entire semiconductor substrate 10 can be amorphous, polycrystalline, or monocrystalline. In addition to the aforementioned types of semiconductor substrates, the semiconductor substrate 10 employed in the present invention can also include a hybrid oriented (HOT) semiconductor substrate in which the HOT substrate has surface regions of different crystallographic orientation.

Examples of semiconductor materials that can be used in forming such nanosheet structures 20 include at least silicon (Si), germanium (Ge), silicon germanium alloys (SiGe), silicon carbide (SiC), silicon germanium carbide (SiGeC), III-V compound semiconductors and/or II-VI compound semiconductors. One skilled in the art can contemplate a number of different semiconductor materials for forming the nanosheet structures 20.

In structure 30, the stack 20 is patterned such that two stacks 20' are created. A recess 32 separates the two stacks 20'. A top surface 11 of the substrate 10 is also exposed.

In structure 35, an organic planarization layer (OPL) 36 is deposited over one of the stacks 20'. The OPL 36 directly contacts a top surface and a sidewall of one stack 20'. A gap 38 remains between the OPL 36 and the other stack 20' that is not covered by any OPL.

In structure 40, a first block material 42 is deposited in the gap 38. The first block material 42 is etched back such that the first block material 42 extends to a top surface of the stacks 20'. The first block material 42 will prevent subsequent removal of SiGe layers 24 from the right-hand stack 20' that is directly contacts. The first block material 42 directly contacts the sidewalls of all of the SiGe layers 24 of the right-hand stack 20'.

In structure 50, the OPL 36 is mostly removed such that an OPL section 36' remains between the left-hand stack 20' and the first block material 42. The recess of the OPL 36 results in exposure of the upper semiconductor layers 22/24 of the right-hand stack 20'.

In structure 55, another OPL 57 is deposited. The OPL 57 directly contacts the top surface of the right-hand stack 20' and the sidewall of the first block material 42.

In structure 60, a second block material 62 is deposited. The second block material 62 is formed between the left-hand stack 20' and the OPL 57. The second block material 62 is smaller than the first block material 42. The second block material 62 has a different shape than the first block material 42. The second block material 62 directly contacts the sidewall of one SiGe layer 24 of the left-hand stack 20'. For example, the second block material 62 directly contacts a sidewall of a middle or central SiGe layer 24.

In structure 65, the OPL 57 is completely removed such that a gap region 67 is formed directly between the stacks 20'. The removal of the OPL 57 results in exposure of the first block material 42 and the second block material 62. The first block material 42 continues to directly contact the sidewalls of all the SiGe layers 24 of the right-hand stack 20' and the second block material 62 continues to directly contact a sidewall of only a single middle or central SiGe layer 24 of the left-hand stack 20'. Thus, sidewalls of two SiGe layers 24 are exposed in the left-hand side stack 20'.

In structure 70, the exposed SiGe layers 24 are removed and metal layers 72 fill in such gaps. Metals layers 72 are thus formed adjacent opposed ends of the SiGe layer 24 that was blocked by the second block material 62. Thus, the exposed SiGe layers 24 are replaced with a conductive material 72.

In structure 75, a conductive material 76 is deposited between the stacks 20' such that the conductive material 76 covers the exposed portions of the first and second block materials 42, 62. The conductive material 76 directly contacts the sidewalls of the metal layers 72. The conductive material 76 and the metal layers 72 can be formed from the same material. This vertical metallization results in a single capacitor with one space. The one space can be defined directly between the metal layers 72. The structure 75 can be referred to as a 2-plate metal-insulator-metal (MIM) capacitor or a two electrode decoupling capacitor. Thus, this a buried capacitor under the device level with vertical connections to different levels of the capacitor.

The OPL 36 can be formed at a predetermined thickness to provide reflectivity and topography control during etching of the layers below. The OPL 36 can include an organic material, such as a polymer. Exemplary organic planarization materials include, but are not limited to, near-frictionless carbon (NFC) material, diamond-like carbon, polyarylene ether, and polyimide. The thickness of the OPL 36 can be in a range from about 10 nm to about 300 nm. In one example, the thickness of the OPL 36 is about 100 nm-150 nm.

Block materials 42, 62 can be deposited by conventional deposition methods such as atomic layer deposition (ALD), chemical vapor deposition (CVD), low pressure CVD (LPCVD), molecular layer deposition (MLD), PECVD or any other known or later developed methods. Block materials 42, 62 can include any barrier material such as a nitride, high temperature oxide (HTO), hafnium oxide, hafnium silicon oxide or other materials or combinations of materials that have a high selectivity on oxide. Block materials 42, 62 can have a thickness in a range from about 30 angstroms to about 170 angstroms depending upon if only nitride or nitride plus HTO are used, but can be thinner or thicker. Block materials 42, 62 protects SiGe layers 24 where metallization does not occur.

The conductive materials 72, 76 can be any conductive materials known in the art, such as, for example, copper (Cu), aluminum (Al), tungsten (W), ruthenium (Ru) or cobalt (Co). The conductive materials 72, 76 can be fabricated using any technique known in the art, such as, for example, a single or dual damascene technique. In an embodiment, the conductive materials 72, 76 can be copper (Cu) and can include a metal liner, where the metal liner can be metals, such as, for example, tantalum nitride and tantalum (TaN/Ta), titanium, titanium nitride, cobalt, ruthenium, and manganese.

The etching can include a dry etching process such as, for example, reactive ion etching, plasma etching, ion etching or laser ablation. The etching can further include a wet chemical etching process in which one or more chemical etchants are used to remove portions of the OPL 36, 57.

In general, regarding the etching of any materials, such materials can be removed by a dry etching process, for example, ashing. Ashing is performed using a suitable reaction gas, for example, $O_2$, $N_2$, $H_2/N_2$, $O_3$, $CF_4$, or any combination thereof. The dry etching process can be combined with a wet etching process. The wet etching process can be performed, for example, with a wet etchant, such as sulfuric acid and hydrogen peroxide. In various example embodiments, the OPL 36, 57 is etched. The etch can, for example, include a wet etch such as a phosphoric acid ($H_3PO_4$) (wet chemistry) etch or a diluted hydrogen fluoride (HF) etch.

Figure 2:
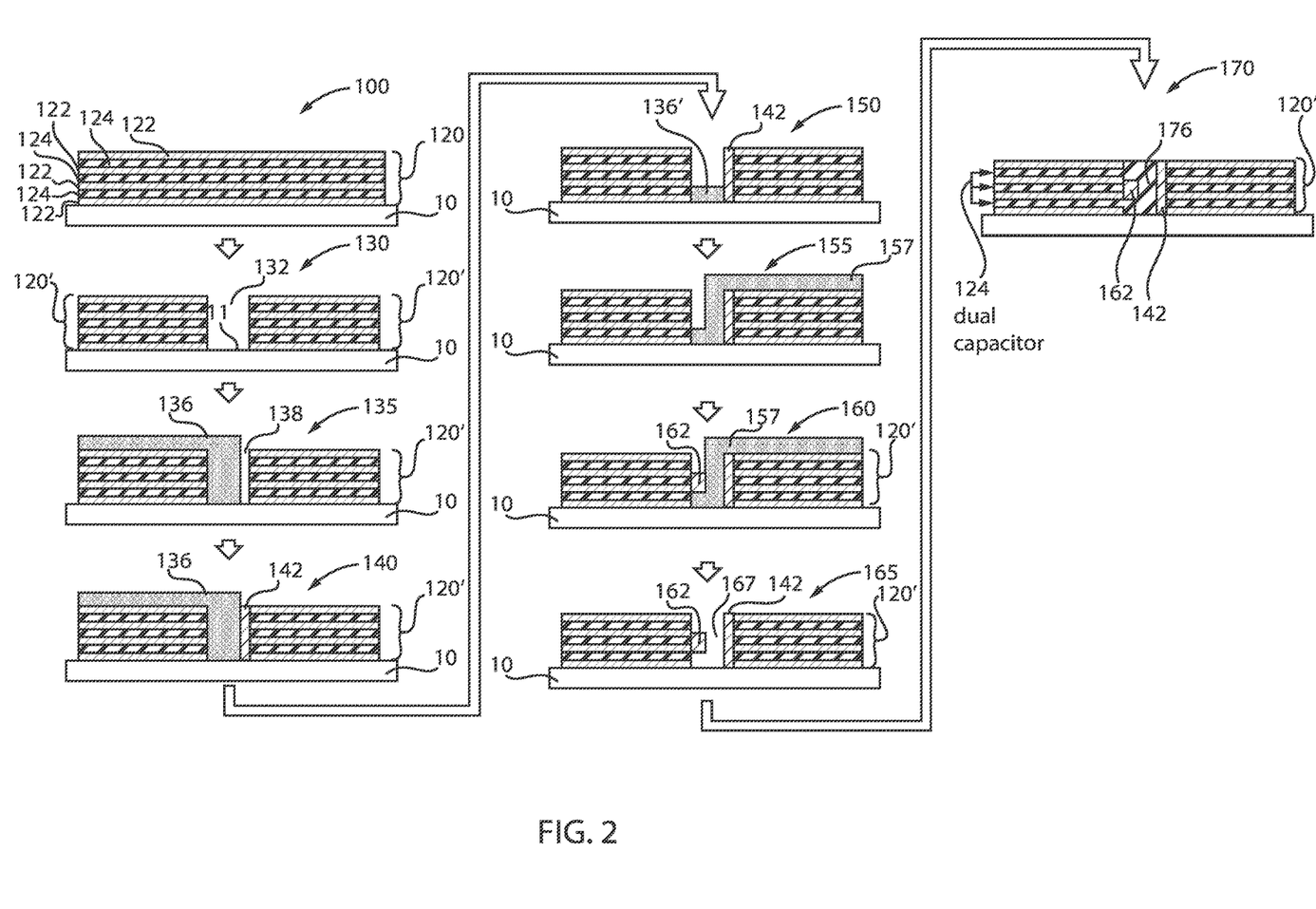
FIG. 2 is a blocked metal plate process flow for forming a vertical interconnect to a buried capacitor (referred to as a 3-electrode decoupling capacitor), in accordance with an embodiment of the present invention.

FIG. 2 is a blocked metal plate process flow for forming a vertical interconnect to a buried capacitor (referred to as a 3-electrode decoupling capacitor), in accordance with an embodiment of the present invention.

Structure 100 includes a semiconductor substrate 10. A stack 120 can be formed over the substrate 10. The stack 120 can include, e.g., alternating layers of a first semiconductor material 122 and a first conductive material 124. The first semiconductor material 122 can be, e.g., silicon (Si).

In structure 130, the stack 120 is patterned such that two stacks 120' are created. A recess 132 separates the two stacks 120'. A top surface 11 of the substrate 10 is also exposed.

In structure 135, an organic planarization layer (OPL) 136 is deposited over one of the stacks 120'. The OPL 136 directly contacts a top surface and a sidewall of one stack 120'. A gap 138 remains between the OPL 136 and the other stack 120' that is not covered by any OPL.

In structure 140, a first block material 142 is deposited in the gap 138. The first block material 142 is etched back such that the first block material 142 extends to a top surface of the stacks 120'. The first block material 142 will prevent subsequent removal of semiconductor layers 122 from the right-hand stack 120' that is directly contacts. The first block material 142 directly contacts the sidewalls of all of the semiconductor layers 122 of the right-hand stack 120'.

In structure 150, the OPL 136 is mostly removed such that an OPL section 136' remains between the left-hand stack 120' and the first block material 142. The recess of the OPL 136 results in exposure of the upper semiconductor layers 122 and upper conductive layers 124 of the right-hand stack 120'.

In structure 155, another OPL 157 is deposited. The OPL 157 directly contacts the top surface of the right-hand stack 120' and the sidewall of the first block material 142.

In structure 160, a second block material 162 is deposited. The second block material 162 is formed between the left-hand stack 120' and the OPL 157. The second block material 162 is smaller than the first block material 142. The second block material 162 has a different shape than the first block material 142. The second block material 162 directly contacts the sidewall of one conductive layer 124 of the left-hand stack 120'. For example, the second block material 162 directly contacts a sidewall of a middle or central conductive layer 124.

In structure 165, the OPL 157 is completely removed such that a gap region 167 is formed directly between the stacks 120'. The removal of the OPL 157 results in exposure of the first block material 142 and the second block material 162. The first block material 142 continues to directly contact the sidewalls of all the conductive layers 124 of the right-hand stack 120' and the second block material 162 continues to directly contact a sidewall of only a single middle or central conductive layer 124 of the left-hand stack 120'. Thus, sidewalls of two conductive layers 124 are exposed in the left-hand side stack 120'.

In structure 170, a conductive material 176 is deposited between the stacks 120' such that the conductive material 176 covers the exposed portions of the first and second block materials 142, 162. The conductive material 176 directly contacts the sidewalls of the exposed conductive layers 124. The conductive material 176 and the exposed conductive layers 124 can be formed from the same material. This vertical metallization results in a dual capacitor with two spaces. The spaces can be defined directly between the conductive layers 124. The structure 170 can be referred to as a 3-plate metal-insulator-metal (MIM) capacitor or a three electrode decoupling capacitor. Thus, this a buried capacitor under the device level with vertical connections to different levels of the capacitor.

Figure 3:
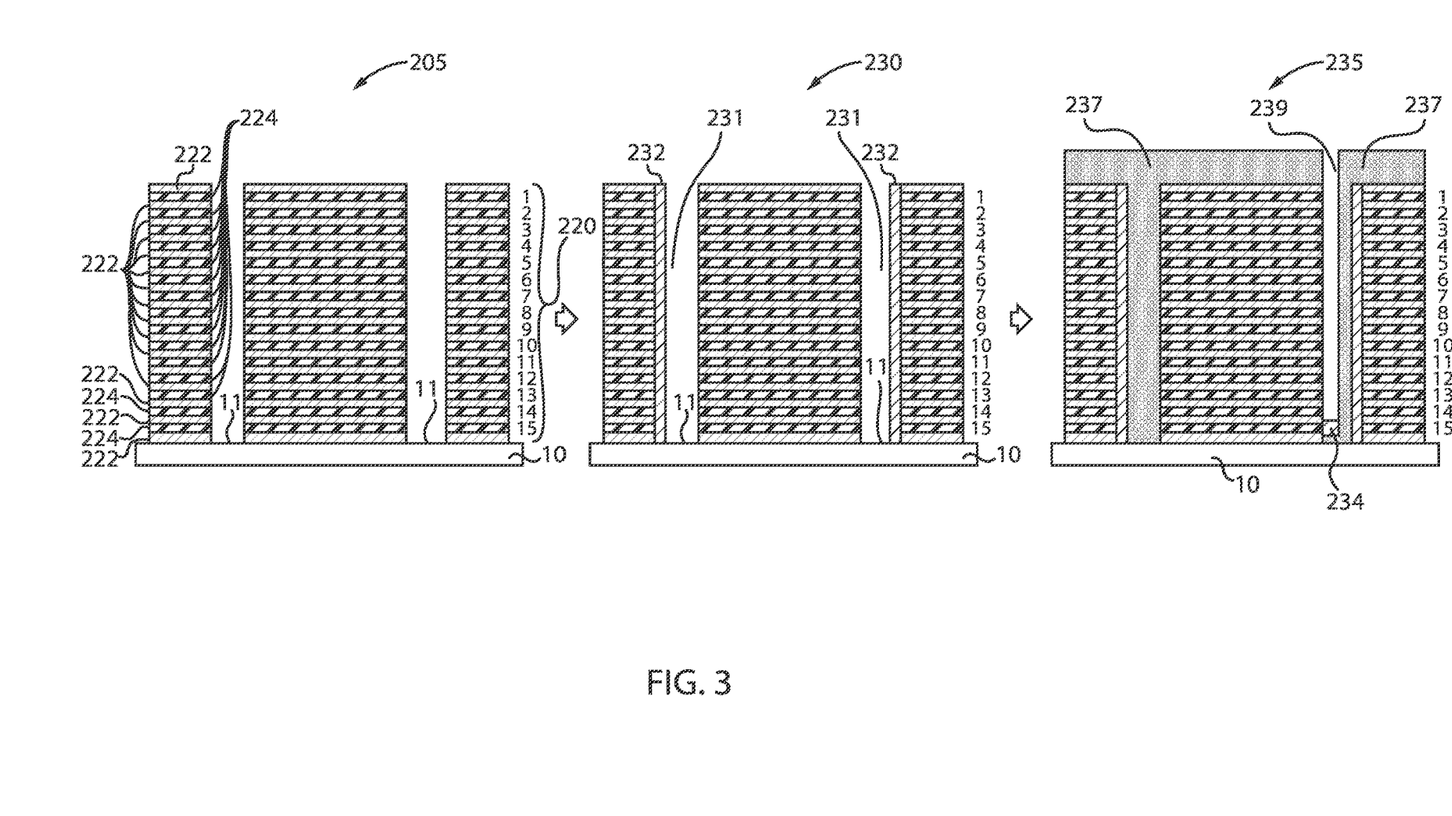
FIG. 3 is a cross-sectional view of a semiconductor structure where a 15-plate electrode stack is patterned to define vias, block materials are deposited within the vias, and an organic planarization layer (OPL) material is selectively deposited, in accordance with an embodiment of the present invention.

FIG. 3 is a cross-sectional view of a semiconductor structure where a 15-plate electrode stack is patterned to define vias, block materials are deposited within the vias, and an organic planarization layer (OPL) material is selectively deposited, in accordance with an embodiment of the present invention.

Structure 205 includes a semiconductor substrate 10. A stack 220 can be formed over the substrate 10. The stack 220 can include, e.g., alternating layers of a semiconductor material 222 and a first conductive material 224. The first semiconductor material 222 can be, e.g., silicon (Si). The stack 220 is etched to form vias extending to a top surface 11 of the substrate 10. The stack includes 15 layers of the first conductive material 224.

In structure 230, a block material 232 is formed within each opening 231 and adjacent portions of stack 220. The block material 232 directly contacts all of the semiconductor layers 222 and all of the conductive layers 224.

In structure 235, an organic planarization layer (OPL) 237 is deposited over portions of the stacks 220. The OPL 237 directly contacts a top surface of all the stacks 220 and sidewalls of some of the stacks 220. A gap 239 remains between the OPL 237 and one section of stack 220. A second block material 234 is deposited within the gap 239 such that it sits on a portion of OPL.

Figure 4:
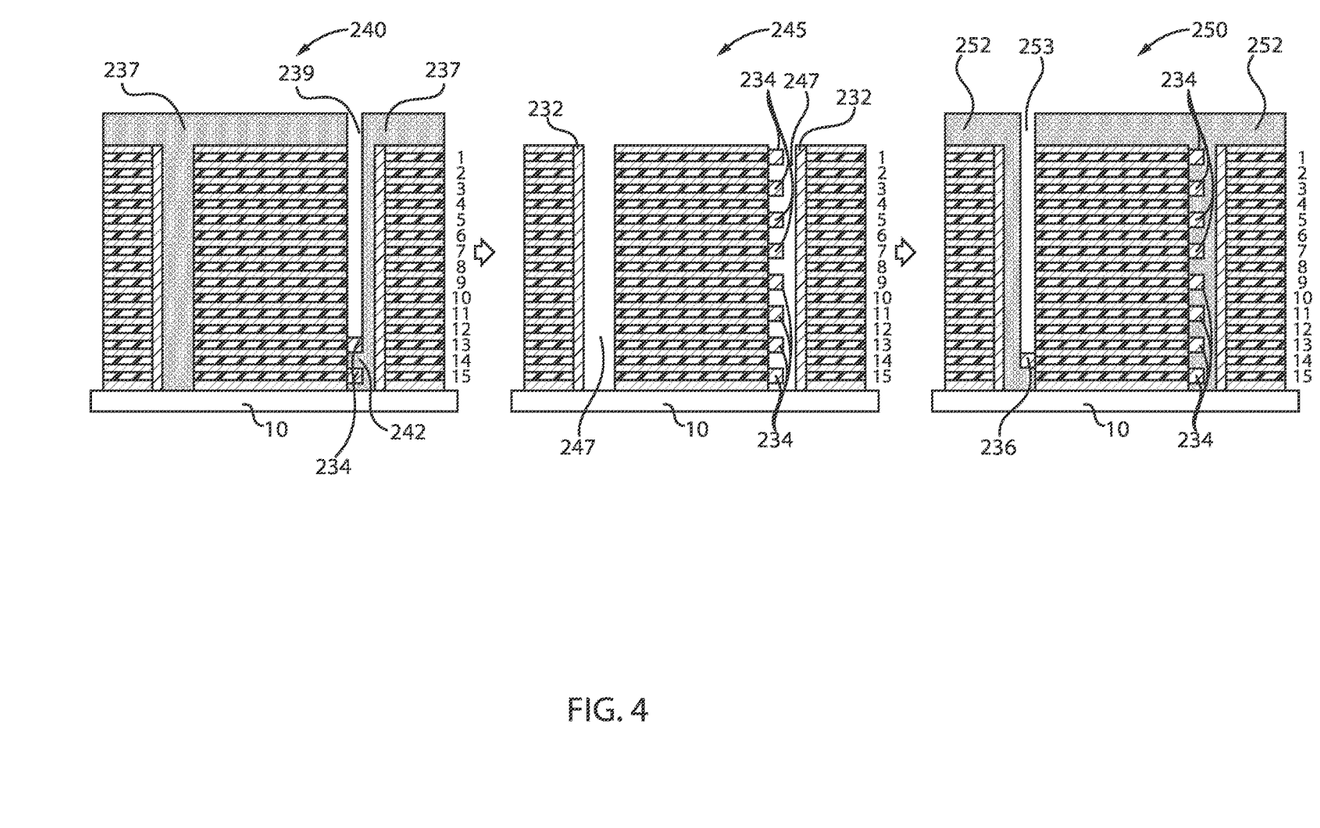
FIG. 4 is a cross-sectional view of the semiconductor structure of FIG. 3 where a second block material is selectively deposited within adjacent electrode layers within one via, in accordance with an embodiment of the present invention.

FIG. 4 is a cross-sectional view of the semiconductor structure of FIG. 3 where a second block material is selectively deposited within adjacent electrode layers within one via, in accordance with an embodiment of the present invention.

In structure 240, an OPL section 242 is deposited over the second block material 234. Then another block material 234 is deposited over the OPL section 242. This sequence of alternately depositing second block material 234 and OPL sections 242 is repeated until a second block material 234 reaches a topmost region of the stack 220.

In structure 245, the second block material 234 has reached the topmost region of the stack 220. The second block material directly contacts sidewalls of alternate conductive layers 224. A gap 247 remains between the first block material 232 and the series of second block materials 234. The OPL 237 is also completely removed such that the first block materials 232 are fully exposed within the openings 247.

In structure 250, another OPL 252 is deposited such that a gap 253 is formed on the left-hand side of the stack 220. A third block material 236 is deposited within the gap 253 such that it sits on a portion of OPL.

Figure 5:
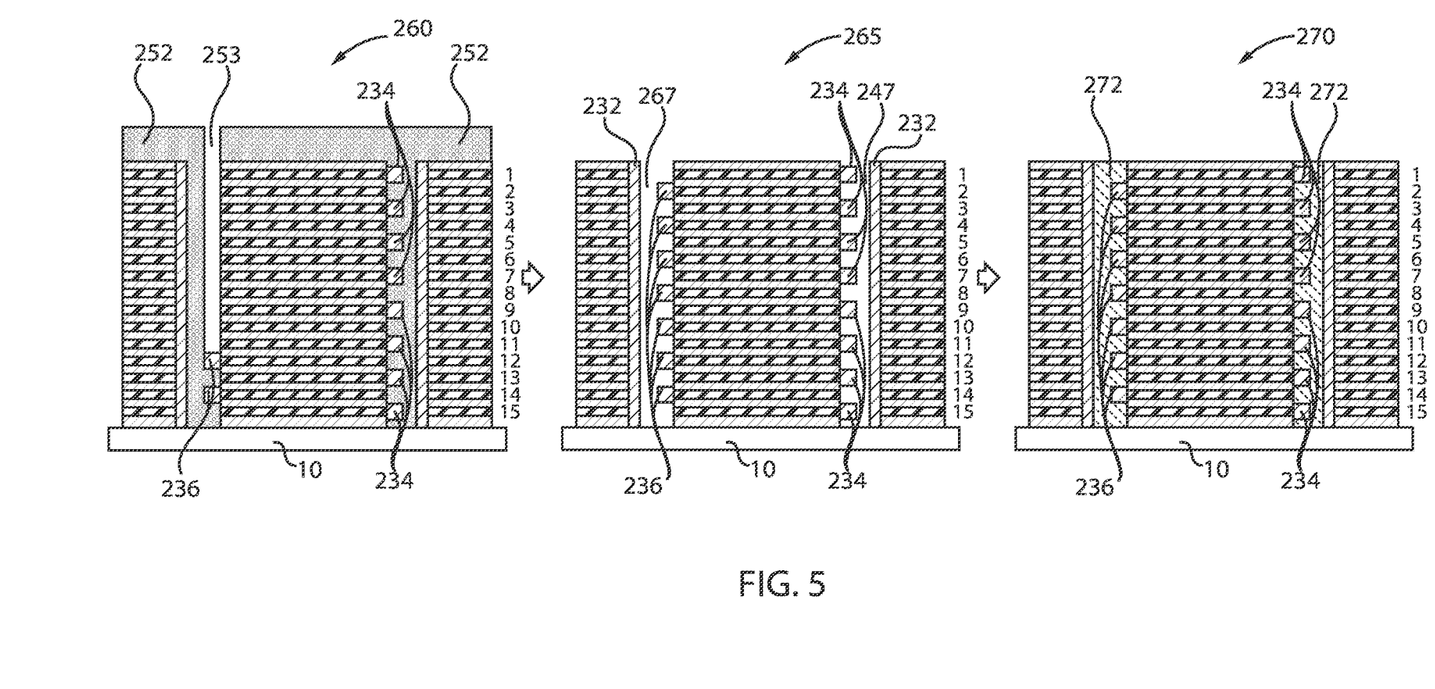
FIG. 5 is a cross-sectional view of the semiconductor structure of FIG. 4 where a second block material is selectively deposited within adjacent electrode layers within the other via, and the vias are metallized, in accordance with an embodiment of the present invention.

FIG. 5 is a cross-sectional view of the semiconductor structure of FIG. 4 where a second block material is selectively deposited within adjacent electrode layers within the other via, and the vias are metallized, in accordance with an embodiment of the present invention.

In structure 260, an OPL section 262 is deposited over the third block material 236. Then another third block material 236 is deposited over OPL section 262. This sequence of alternately depositing third block material 236 and OPL sections 262 is repeated until a third block material 236 reaches a topmost region of the stack 220.

In structure 265, the third block material 236 has reached the topmost region of the stack 220. The third block material 236 directly contacts sidewalls of alternate conductive layers 224. A gap 267 remains between the first block material 232 and the series of third block materials 236. Thus, the series of second block materials 234 directly contacts one side of each of the alternate conductive layers 224 and the series of third block materials 236 directly contacts the other side of each of the alternate conductive layers 224. Therefore, the alternate conductive layers 224 are blocked on opposed ends thereof by the second and third block materials 234, 236. Moreover, one gap 267 includes a first block material 232 and the series of second block materials 234 and the other gap 267 includes a first block material 232 and the series of third block materials 236. The OPL 252 is further removed.

In structure 270, a conductive material 272 is deposited within the gaps 247, 267. The conductive material 272 directly contacts the entire exposed sidewall of the first block material 232 and directly contacts all of the second and third block materials 234, 236.

The series of first block materials 234 is horizontally offset from the series of second block materials 236. In other words, the series of first block materials 234 directly contacts sidewalls of conductive layers 2, 4, 6, 8, 10, 12, 14, whereas the series of second block materials 236 directly contacts sidewalls of conductive layers 1, 3, 5, 7, 9, 11, 13, and 15. As a result, alternating layers are blocked in one via and a different set of alternating layers are blocked in another via.

The conductive material 272 and the conductive layers 224 can be formed from the same material. This vertical metallization results in a multi-capacitor. The structure 270 can be referred to as a 15-plate metal-insulator-metal (MIM) capacitor or a fifteen electrode decoupling capacitor. Thus, this a buried capacitor under the device level with vertical connections to different levels of the capacitor. The 15-plate MIM capacitor can have at least a 10% performance benefit over conventional MIM capacitors.

The conductive materials 224, 272 can be any conductive materials known in the art, such as, for example, copper (Cu), aluminum (Al), tungsten (W), ruthenium (Ru) or cobalt (Co). The conductive materials 224, 272 can be fabricated using any technique known in the art, such as, for example, a single or dual damascene technique. In an embodiment, the conductive materials 224, 272 can be copper (Cu) and can include a metal liner, where the metal liner can be metals, such as, for example, tantalum nitride and tantalum (TaN/Ta), titanium, titanium nitride, cobalt, ruthenium, and manganese.

In summary, the device structure of the exemplary embodiments of the present invention includes a scalable multi-level interconnect through a vertical via (pillar) below complementary metal oxide semiconductor (CMOS) device levels. The structure includes multiple levels of patterned connections between metal layers. The method of the exemplary embodiments of the present invention includes forming a multi-level of interconnects underneath the CMOS device level where the metal plates are formed directly or through replacement metallization. The method further connects both sequential and non-sequential order multi-level buried metal plates underneath a CMOS device level.

Regarding FIGS. 1-5, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of metal replacement vertical interconnections for high-density buried capacitance (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming a multi-level of interconnects underneath a complementary metal oxide semiconductor (CMOS) device, the method comprising:
   forming a stack including alternating layers of first and second semiconductor materials;
   patterning a via in the stack to define a first stack portion and a second stack portion;
   depositing a first block material within one side of the via such that the first block material directly contacts all of the alternating layers of the first and second semiconductor materials of the first stack portion;
   depositing a second block material within another side of the via such that the second block material directly contacts one layer of the second semiconductor material of the second stack portion;
   removing exposed second semiconductor material layers from the second stack portion to form openings;
   filling the openings with a first conductive material; and
   performing vertical metallization between the first and second block materials.

2. The method of claim 1, wherein a single capacitor is formed in the second stack portion.

3. The method of claim 1, wherein the second block material has a same or different shape than the first block material.

4. The method of claim 1, wherein the vertical metallization includes depositing a second conductive material.

5. The method of claim 4, wherein the first and second conductive materials are constructed from the same material.

6. The method of claim 1, wherein the first semiconductor material is silicon (Si) and the second semiconductor material is silicon germanium (SiGe).

7. A method forming a multi-level of interconnects underneath a complementary metal oxide semiconductor (CMOS) device, the method comprising:
   forming a stack including alternating layers of a semiconductor material and a first conductive material;
   patterning a via in the stack to define a first stack portion and a second stack portion;
   depositing a first block material within one side of the via such that the first block material directly contacts all of the alternating layers of the semiconductor material and the first conductive material of the first stack portion;
   depositing a second block material within another side of the via such that the second block material directly contacts one layer of the first conductive material of the second stack portion; and
   performing vertical metallization between the first and second block materials.

8. The method of claim 7, wherein a dual capacitor is formed in the second stack portion.

9. The method of claim 7, wherein the second block material has a same or different shape than the first block material.

10. The method of claim 7, wherein the vertical metallization includes depositing a second conductive material.

11. The method of claim 10, wherein the first conductive material and the second conductive material are constructed from the same material.

12. The method of claim 11, wherein the semiconductor material is silicon (Si) and the first and second conductive materials are copper (Cu).

13. A method for forming a multi-level of interconnects underneath a complementary metal oxide semiconductor (CMOS) device, the method comprising:
forming a stack including alternating layers of a semiconductor material and a first conductive material;
patterning vias in the stack to define multiple stacks;
depositing a first block material within each of the vias;
forming a series of first block materials within a first via;
forming a series of second block materials within a second via, the first and second vias being on opposed ends of a stack of the multiple stacks; and
performing vertical metallization between the first block material and the series of first block materials in the first via, and between the first block material and the series of second block materials in the second via.

14. The method of claim 13, wherein a fifteen electrode decoupling capacitor is formed.

15. The method of claim 13, wherein the first block material has a same or different shape than the series of first block materials.

16. The method of claim 15, wherein the first block material has a same or different shape than the series of second block materials.

17. The method of claim 13, wherein the vertical metallization includes depositing a second conductive material.

18. The method of claim 17, wherein the first conductive material and the second conductive material are constructed from the same material.

19. The method of claim 13, wherein the series of first block materials is horizontally offset from the series of second block materials.

20. The method of claim 13, wherein the first block material extends an entire length of the stack.

* * * * *